(12) United States Patent
Yoshida et al.

(10) Patent No.: US 8,102,003 B2
(45) Date of Patent: Jan. 24, 2012

(54) RESISTANCE MEMORY ELEMENT, METHOD OF MANUFACTURING RESISTANCE MEMORY ELEMENT AND SEMICONDUCTOR MEMORY DEVICE

(75) Inventors: Chikako Yoshida, Kawasaki (JP); Hideyuki Noshiro, Kawasaki (JP); Takashi Iiduka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 46 days.

(21) Appl. No.: 12/473,469

(22) Filed: May 28, 2009

(65) Prior Publication Data
US 2009/0236581 A1 Sep. 24, 2009

Related U.S. Application Data

(63) Continuation of application No. PCT/JP2006/323938, filed on Nov. 30, 2006.

(51) Int. Cl.
*H01L 29/40* (2006.01)
(52) U.S. Cl. .......... 257/364; 257/E21.078; 257/E47.001
(58) Field of Classification Search .................. 257/364, 257/E47.001, E21.078
See application file for complete search history.

(56) References Cited

U.S. PATENT DOCUMENTS

| 7,045,840 B2 * | 5/2006 | Tamai et al. ................. 257/295 |
| 2004/0245557 A1 | 12/2004 | Seo et al. |
| 2005/0206892 A1 | 9/2005 | Wang et al. |
| 2006/0054950 A1 | 3/2006 | Baek et al. |

FOREIGN PATENT DOCUMENTS

| JP | 2002-289793 A | 10/2002 |
| JP | 2006-86310 A | 3/2006 |
| KR | 10-2004-0104967 A | 12/2004 |
| KR | 10-2006-0023860 A | 3/2006 |

OTHER PUBLICATIONS

Paul C. McIntyre and Scott R. Summerfelt, "Oxidation kinetics of TiN layers: Exposed and beneath Pt thin films", 1997 American Institute of Physics.*
Fujimoto, Masayuki et al.; "High-Speed Resistive Switching of TiO2/TiN Nano-Crystalline Thin Film"; Japanese Journal of Applied Physics, vol. 45, No. 11, 2006, pp. L310-L312.
Yoshida, Chikako et al.; "High Speed Resistive Switching in Pt/TiO2/TiN Resistor for Multiple-Valued Memory Device"; Extended Abstracts of the 2006 International Conference on Solid State Devices and Materials, 2006, pp. 580-581.
Kinoshita, K. et al.; "Bias polarity dependent data retention of resistive random access memory consisting of binary transition metal oxide"; Applied Physics Letters, vol. 89, 103509, 2006.
Kinoshita, K. et al.; "New Model Proposed for Switching Mechanism of ReRAM"; Proc. IEEE Non-Volatiles Semiconductor Memory Workshop, pp. 84-85.
Korean Notice of Preliminary Rejection, English-language translation, mailed Feb. 11, 2011 for corresponding Korean Application No. 10-2009-7010597.

* cited by examiner

*Primary Examiner* — Bradley K Smith
*Assistant Examiner* — Mohammad T Karimy
(74) *Attorney, Agent, or Firm* — Fujitsu Patent Center

(57) ABSTRACT

A resistance memory element which memorizes a high resistance state and a low resistance state and is switched between the high resistance state and the low resistance state by an application of a voltage includes a first electrode layer of titanium nitride film, a resistance memory layer formed on the first electrode layer and formed of titanium oxide having a crystal structure of rutile phase, and a second electrode layer formed on the resistance memory layer.

2 Claims, 15 Drawing Sheets

RESISTANCE MEMORY ELEMENT, METHOD OF MANUFACTURING RESISTANCE MEMORY ELEMENT AND SEMICONDUCTOR MEMORY DEVICE

CROSS REFERENCE TO RELATED APPLICATIONS

This application is a Continuation of International Application No. PCT/JP2006/323938, with an international filing date of Nov. 30, 2006, which designating the United States of America, the entire contents of which are incorporated herein by reference.

FIELD

The embodiments discussed herein are related to a resistance memory element memorizing plurality of resistance states of different resistance values, method of manufacturing the resistance memory element, and a semiconductor memory device using the resistance memory element.

BACKGROUND

Recently, as a new memory device, a nonvolatile semiconductor memory device called ReRAM (Resistance Random Access Memory) is noted. The ReRAM uses a resistance memory element which has a plurality of resistance states of different resistance values, which are changed by electric stimulations applied from the outside and whose high resistance state and low resistance state are corresponded to, e.g., information "0" and "1" to be used as a memory element. The ReRAM highly potentially has high speed, large capacities, low electric power consumption, etc. and is considered prospective.

The resistance memory element has a resistance memory material whose resistance states are changed by the application of voltages sandwiched between a pair of electrodes. As the typical resistance memory material, oxide materials containing transition metals are known.

The following are examples of related art of the present invention: M. Fujimoto et al., "High-speed resistive switching of $TiO_2$/TiN nano-crystalline thin film", Japanese Journal of Applied Physics, Vol. 45, No. 11, 2006, pp. L310-L312; C. Yoshida et al., "High speed resistive switching in Pt/$TiO_2$/TiN resistor for multiple-valued memory device", Extended Abstracts of the 2006 International Conference on Solid State Devices and Materials, 2006, pp. 580-581; and K. Kinoshita et al., Applied Physics Letters, Vol. 89, 2006, 103509.

The write operation of the resistance memory element, which changes the resistance state includes the operation which changes the high resistance state into the low resistance state (set operation) and the operation which changes the low resistance state into the high resistance state (reset operation). The write operation also includes the bipolar operation which makes the set operation and the reset operation by applying voltages of different polarities and the unipolar operation which makes the set operation and the reset operation by applying voltages of the same polarity.

Generally, the switching speed of the resistance memory element making the bipolar operation is about tens nsec—hundreds nsec for both the set operation and the reset operation. The switching speed of the resistance memory element making the unipolar operation is about tens nsec for the set operation and about some μsec for the reset operation.

Thus, the switching speed of the conventional resistance memory element cannot be said to be sufficiently high in comparison with that of the other semiconductor memory devices and is required to be further increased. For the lower electric power consumption, it is preferable that the switching current is as small as possible.

According to one aspect of an embodiment, there is provided a resistance memory element which memorizes a high resistance state and a low resistance state and is switched between the high resistance state and the low resistance state by an application of a voltage, including a first electrode layer of a titanium nitride film, a resistance memory layer formed on the first electrode layer and formed of a titanium oxide having a crystal structure of rutile phase, and the second electrode layer formed on the resistance memory layer.

According to another aspect of an embodiment, there is provided a method of manufacturing a resistance memory element including forming a first electrode layer of a titanium nitride film, thermally oxidizing a surface of the titanium nitride film to form a resistance memory layer of a titanium oxide having a crystal structure of rutile phase, and forming a second electrode layer on the resistance memory layer.

According to further another aspect of an embodiment, there is provided a semiconductor memory device including a resistance memory element including a first electrode layer of a titanium nitride film, a resistance memory layer formed on the first electrode layer and formed of titanium oxide having a crystal structure of rutile phase, and a second electrode layer formed on the resistance memory layer, for memorizing a high resistance state and a low resistance state and being switched between the high resistance state and the low resistance state by an application of a voltage, and a select transistor connected to the first electrode layer or the second electrode layer of the resistance memory element.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

The resistance memory element and method of manufacturing the same according to a first embodiment will be explained with reference to FIGS. 1 to 10.

Figure 1:
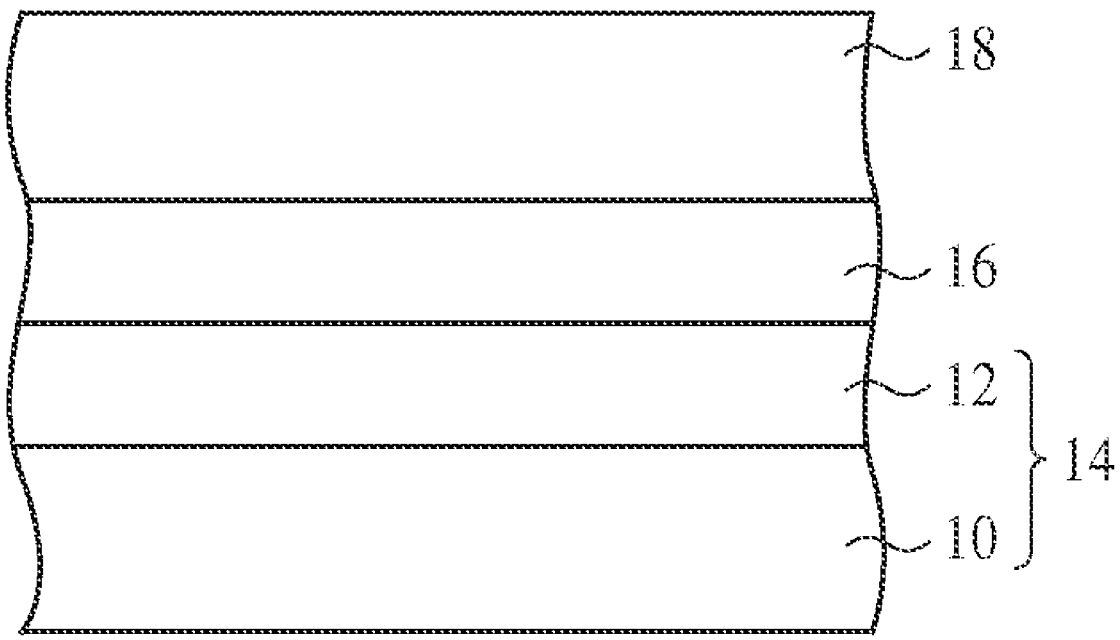
FIG. 1 is a diagrammatic sectional view illustrating a structure of the resistance memory element according to a first embodiment.
Figure 2A:
FIGS. 2A-2C are sectional views illustrating a method of manufacturing the resistance memory element according to the first embodiment.
Figure 2B:
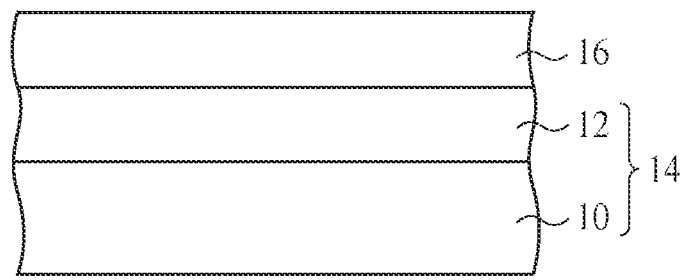
Figure 2C:
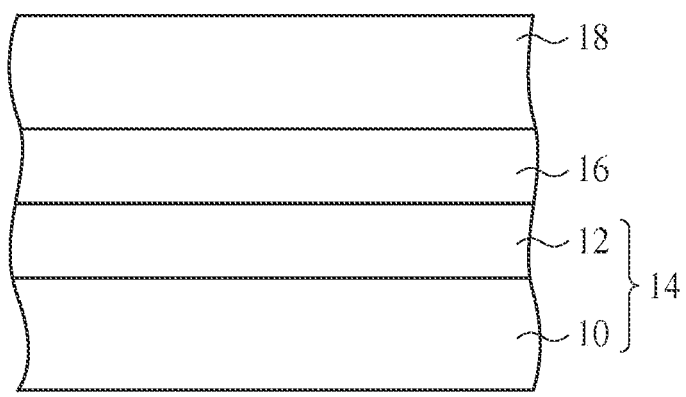
Figure 3:
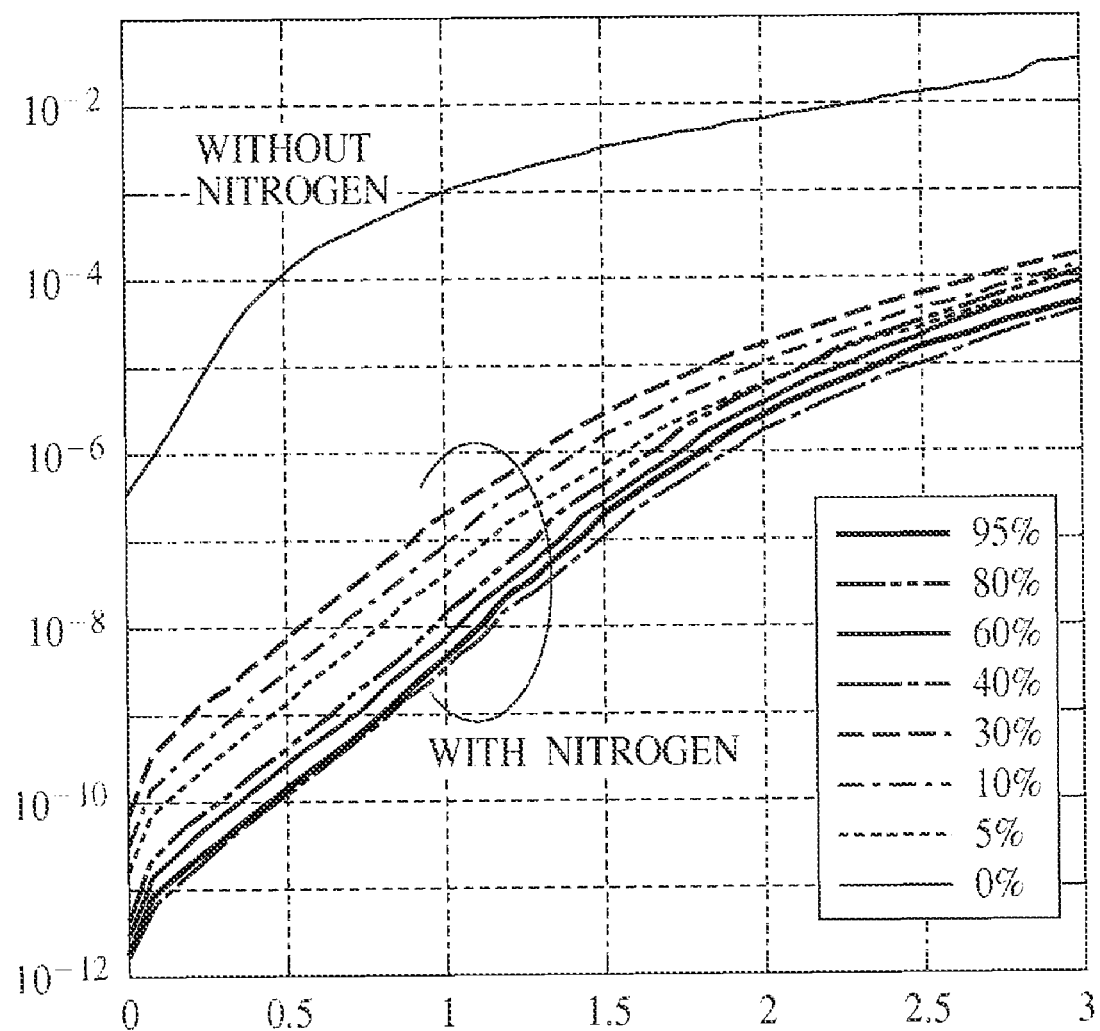
FIG. 3 is a graph illustrating the current-voltage characteristics of the resistance memory element before the forming.
Figure 4:
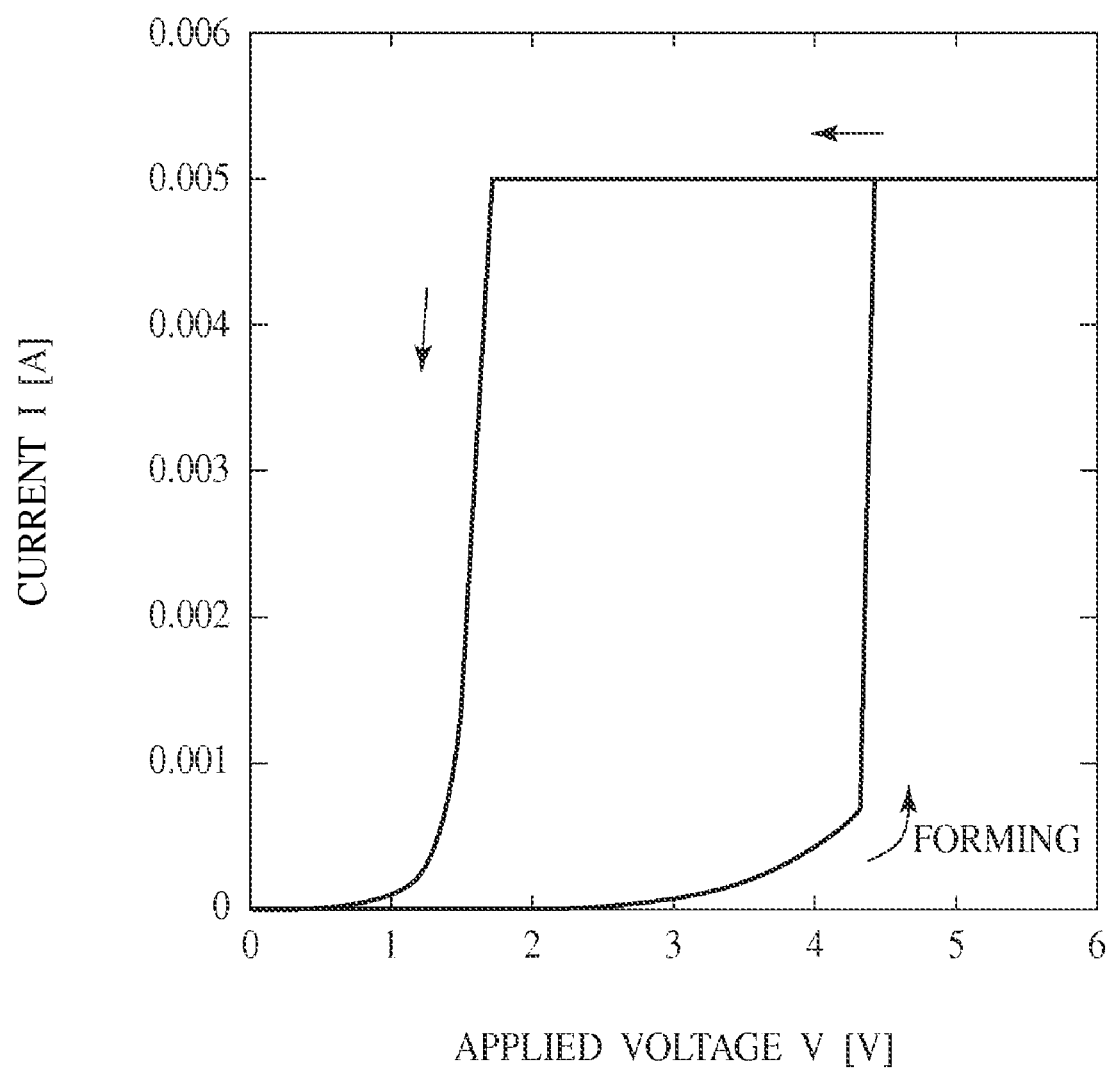
FIG. 4 is a graph illustrating the current-voltage characteristics of the resistance memory element according to the first embodiment in the forming.
Figure 5:
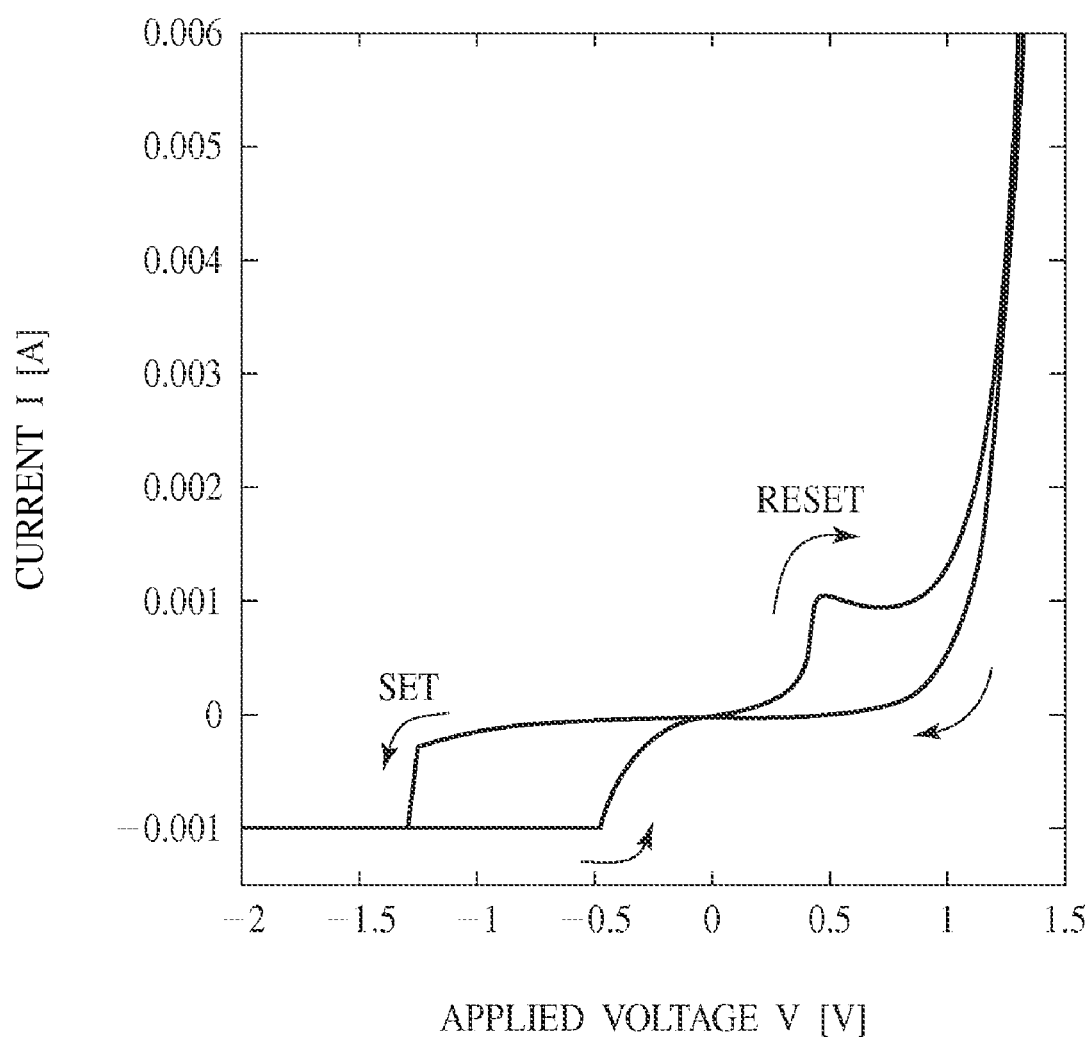
FIG. 5 is a graph illustrating the current-voltage characteristics of the resistance memory element according to the first embodiment in the bipolar operation.
Figure 6:
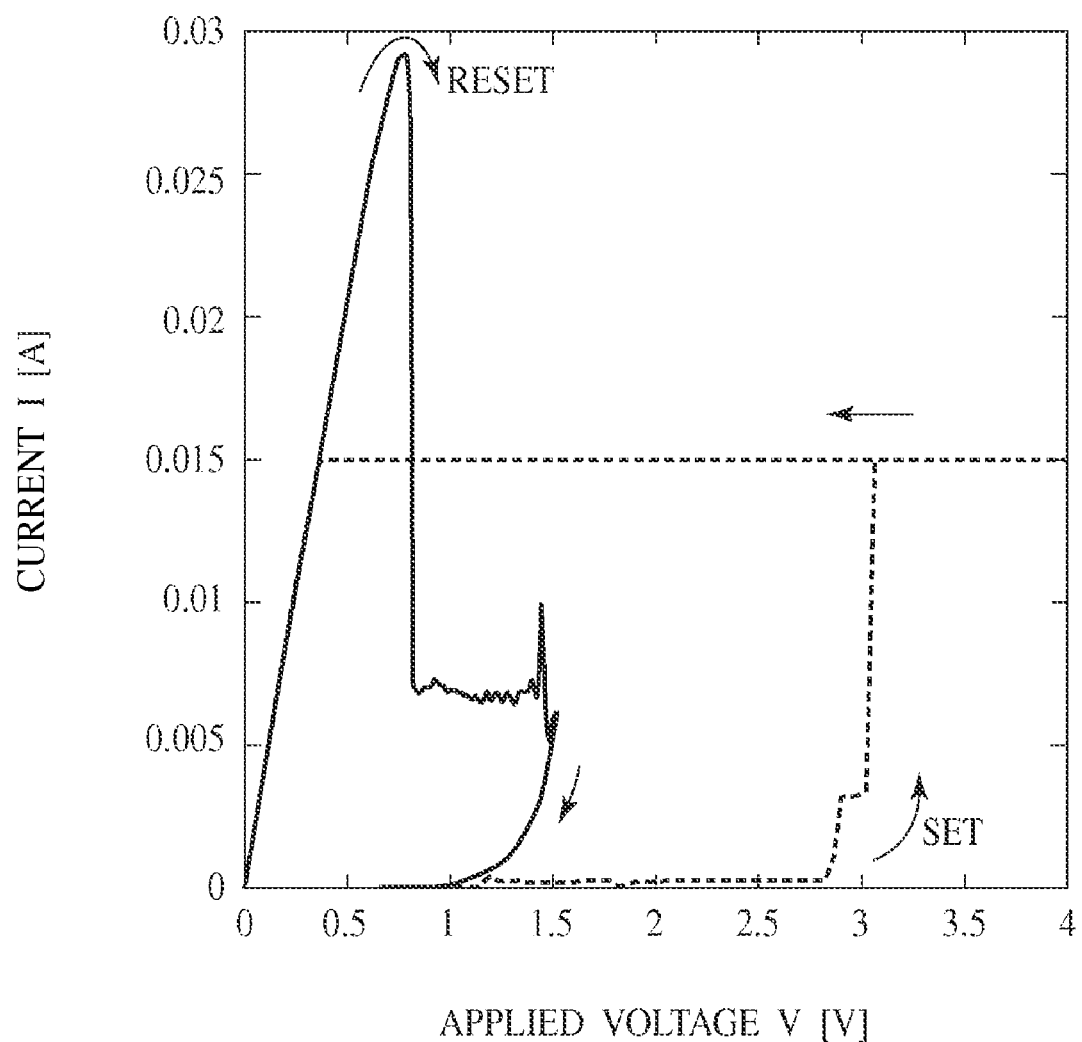
FIG. 6 is a graph illustrating the current-voltage characteristics of the resistance memory element according to the first embodiment in the unipolar operation.
Figure 7:
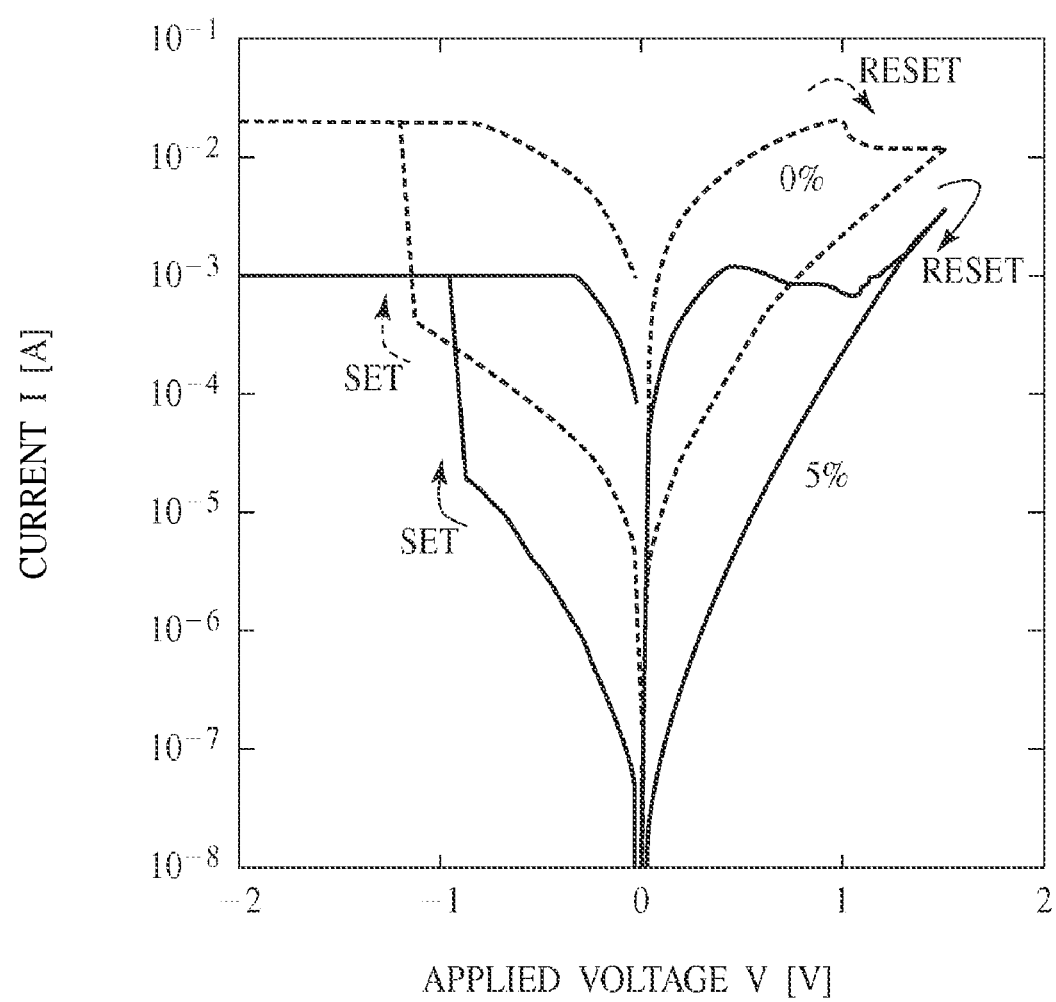
FIG. 7 is a graph illustrating the current-voltage characteristics of the resistance memory elements with nitrogen added to the sputter gas and with no nitrogen added to the sputter gas.
Figure 8:
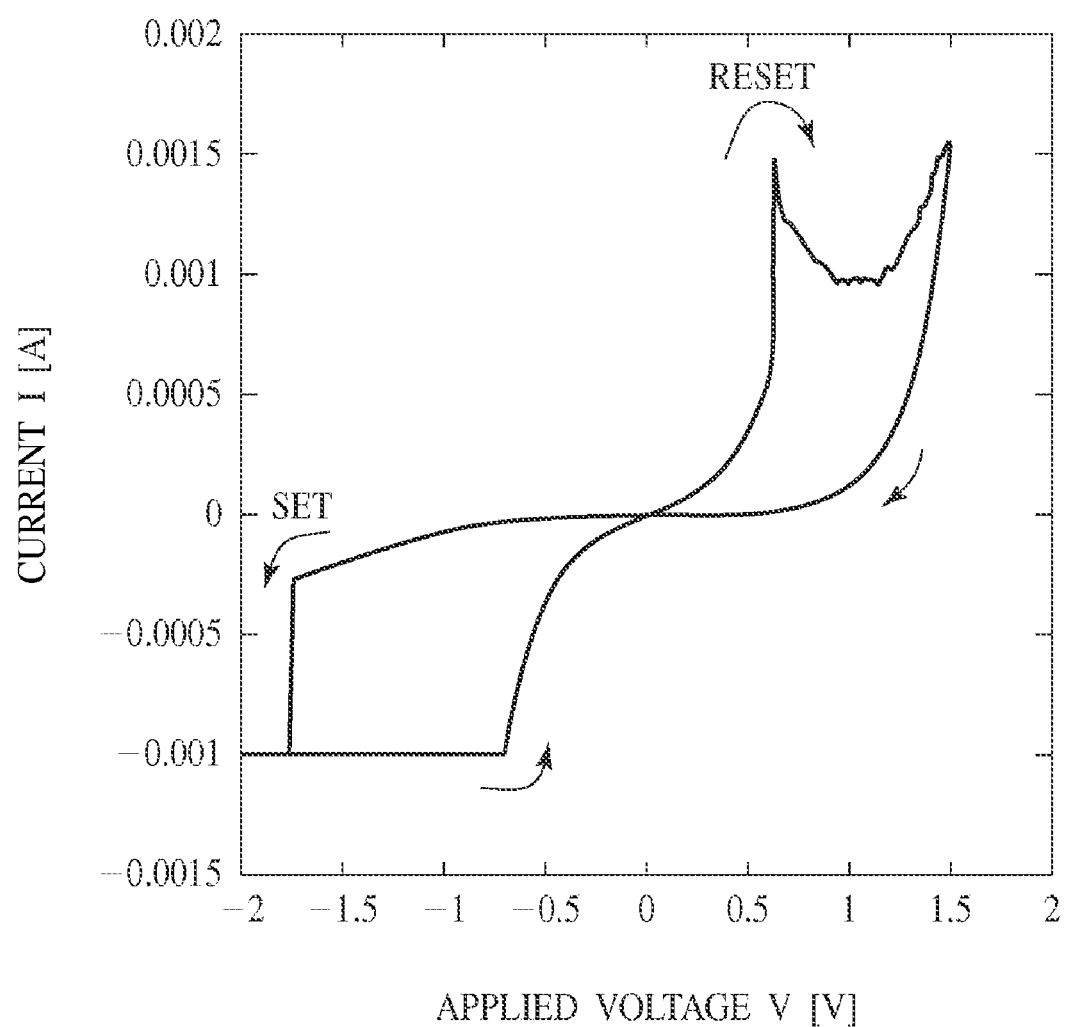
FIG. 8 is a graph illustrating the current-voltage characteristics of the resistance memory element with the titanium nitride film before oxidation set at a 50 nm-thickness.
Figure 9:
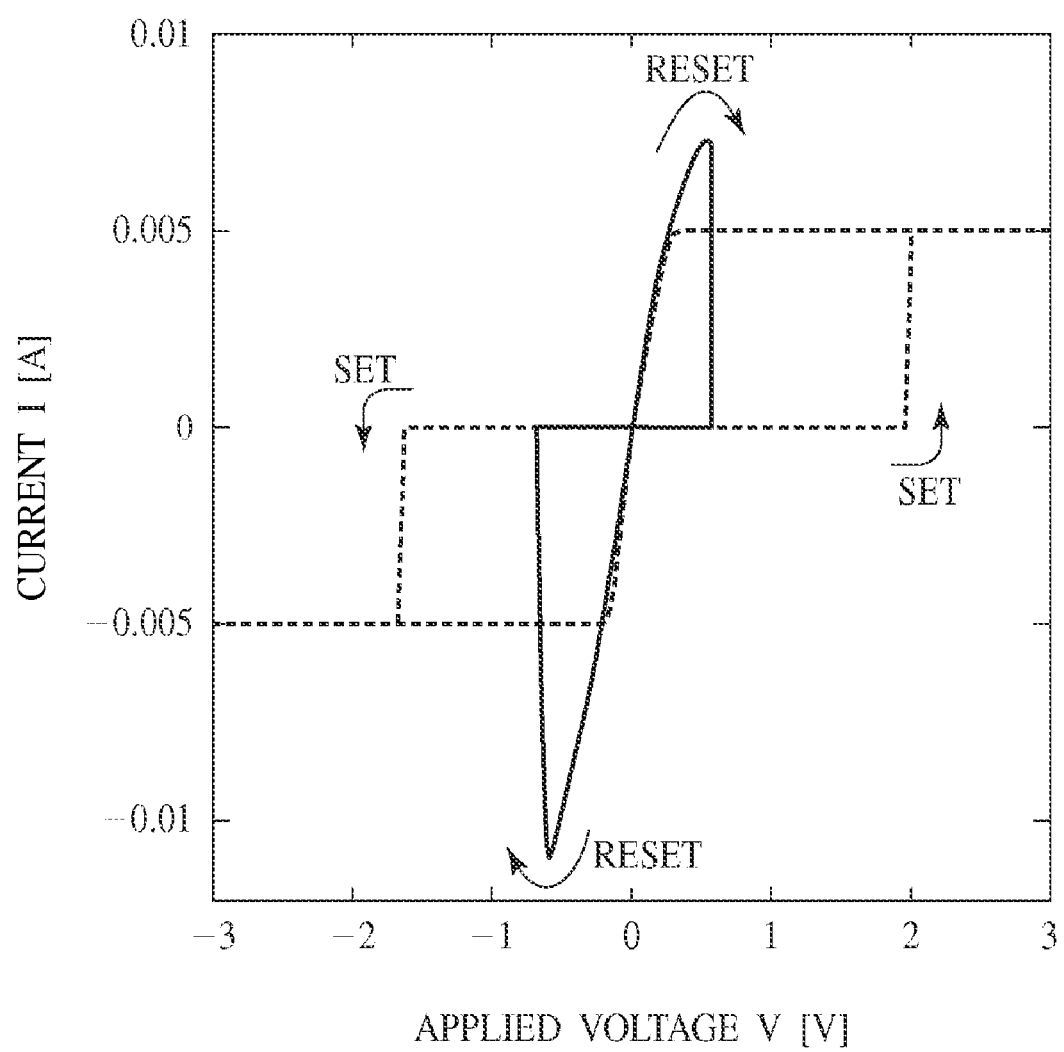
FIG. 9 is a graph illustrating the current-voltage characteristics of the resistance memory element with the titanium nitride film before oxidation set at a 30 nm-thickness.
Figure 10:
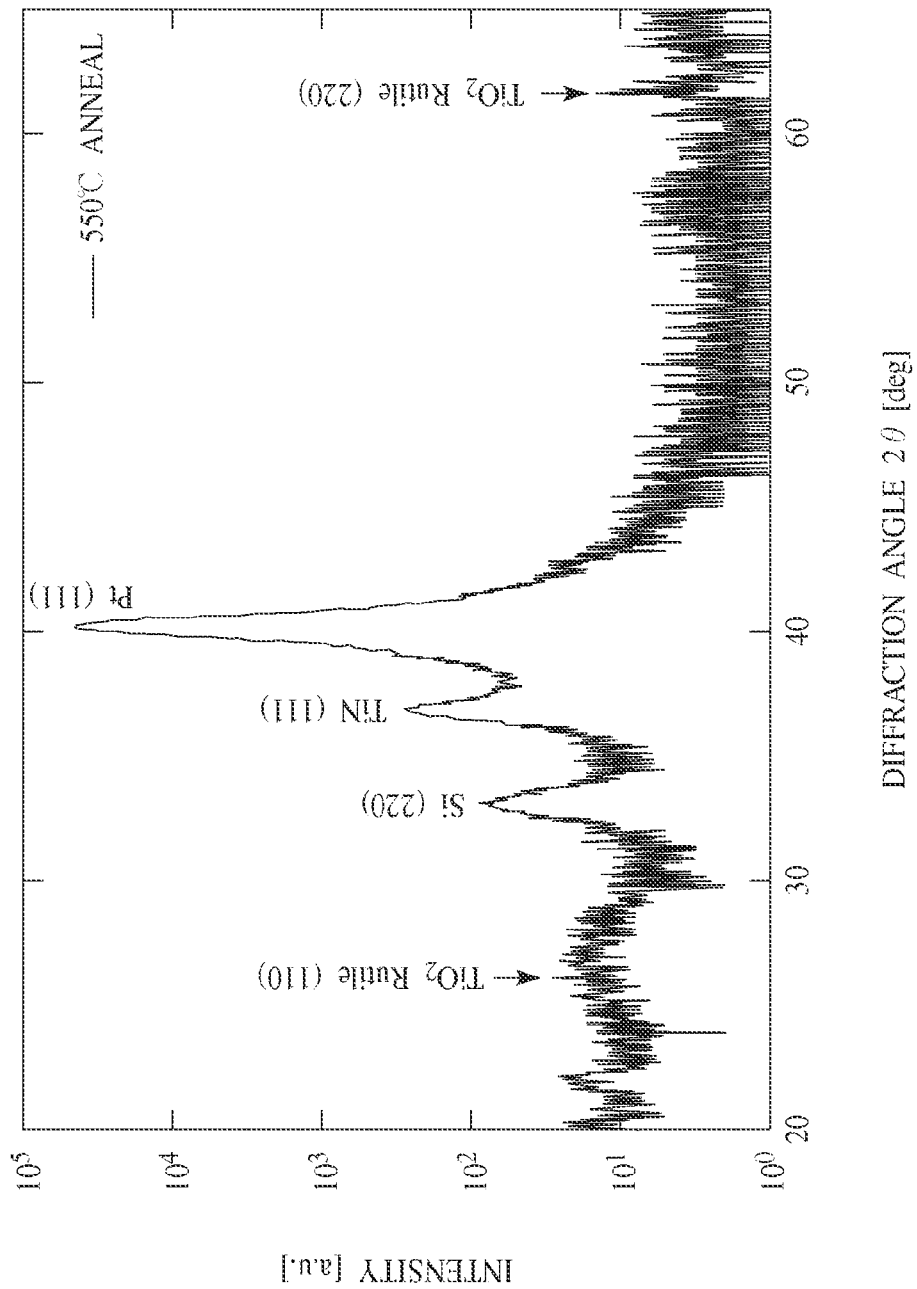
FIG. 10 is a graph illustrating the X-ray diffraction spectrum of a sample having the titanium oxide film formed by thermally oxidizing the titanium nitride film.

FIG. 1 is a diagrammatic sectional view illustrating a structure of the resistance memory element according to the present embodiment. FIGS. 2A-2C are sectional views illustrating a method of manufacturing the resistance memory element according to the present embodiment. FIG. 3 is a graph illustrating the current-voltage characteristics of the resistance memory element before the forming. FIG. 4 is a graph illustrating the current-voltage characteristics of the resistance memory element according to the first embodiment in the forming. FIG. 5 is a graph illustrating the current-voltage characteristics of the resistance memory element according to the present embodiment in the bipolar operation. FIG. 6 is a graph illustrating the current-voltage characteristics of the resistance memory element according to the present embodiment in the unipolar operation. FIG. 7 is a graph illustrating the current-voltage characteristics of the resistance memory elements with nitrogen added to the sputter gas and with no nitrogen added to the sputter gas. FIG. 8 is a graph illustrating the current-voltage characteristics of the resistance memory element with the titanium nitride film before oxidation set at a 50 nm-thickness. FIG. 9 is a graph illustrating the current-voltage characteristics of the resistance memory element with the titanium nitride film before oxidation set at a 30 nm-thickness. FIG. 10 is a graph illustrating the X-ray diffraction spectrum of a sample having the titanium oxide film formed by thermally oxidizing the titanium nitride film.

First, the structure of the resistance memory element according to the present embodiment will be explained with reference to FIG. 1.

On a lower electrode layer 14 of the layer film of a platinum (Pt) film 10 and a titanium nitride (TiN) film 12, a resistance memory layer 16 of titanium oxide ($TiO_2$) having the crystal structure of rutile phase is formed. On the resistance memory layer 16, an upper electrode layer 18 of platinum film is formed.

Next, the method of manufacturing the resistance memory element according to the present embodiment will be explained with reference to FIGS. 2A-2C.

First, on the platinum film 10 as the base, a titanium nitride film 12 of, e.g., a 200 nm-thickness is deposited by, e.g., reactive sputtering method. Thus, the lower electrode layer 14 of the platinum film 10 and the titanium nitride film 12 is formed (FIG. 2A). As the film forming conditions, for example, a substrate temperature is 300° C., a power is 8 kW, a sputter target is titanium, a sputter gas is a mixed gas of nitrogen ($N_2$) and argon (Ar). The flow rate of the nitrogen gas is, e.g., 5-95% of a total gas flow rate.

Then, in an oxygen atmosphere, thermal processing is made in the temperature range of 500-600° C. and for 30 minutes to thermally oxidize the surface of the titanium nitride film 12. Thus, the resistance memory layer 16 of titanium oxide ($TiO_2$) film of, e.g., a 70 nm-thickness is formed on the lower electrode layer 14.

By thermally oxidizing the titanium nitride film 12 at 500-600° C., the formed titanium oxide film is formed of about 10 nm-particle diameter crystallites of the rutile phase. When the thermal oxidation is made at about 400° C., the formed titanium oxide film has the crystal structure of anatase phase.

When the titanium nitride film 12 is oxidized to form the resistance memory layer 16 of titanium oxide film, the thermal oxidation conditions are adjusted suitably so that the titanium nitride film 12 remains between the platinum film 10 and the resistance memory layer 16 after oxidized. When the titanium nitride film of a 200 nm-thickness is thermally oxidized to form the titanium oxide film of a 70 nm-thickness, the film thickness of the remaining titanium nitride film 12 is 150 nm.

Next, on the thus-formed resistance memory layer 16, a platinum film is deposited by, e.g., sputtering method, and the upper electrode layer 18 of the platinum film is formed (FIG. 2C)

As described above, in the resistance memory element according to the present embodiment, the resistance memory layer 16 is formed of titanium oxide having the crystal structure of rutile phase, and one of the electrodes (the lower electrode layer 14), which is in contact with the resistance memory layer 16 is formed of the titanium nitride film 12. In the method of manufacturing the resistance memory element according to the present embodiment, the titanium nitride film 12 thermally oxidized to thereby form the resistance memory layer 16 of titanium oxide film having crystal structure of rutile phase. The resistance memory element is thus constituted, whereby the switching speed can be increased while the switching current can be decreased.

The above-described features of the resistance memory element and the method of manufacturing the same according to the present embodiment will be explained below in combination with the evaluation result of the resistance memory element.

FIG. 3 is a graph illustrating the current-voltage characteristics of the resistance memory element in the initial state before forming. In the graph, "without nitrogen" means that no nitrogen was added to the sputter gas for depositing the titanium nitride film 12, i.e., the cases that titanium film was formed in place of the titanium nitride film 12. In the graph, "with nitrogen" means the case that the addition ratio of nitrogen added to the sputter gas for depositing the titanium nitride film 12 were changed between 5 and 95%.

As shown in FIG. 3, in the samples with nitrogen added to the sputter gas, the current values largely decrease in comparison with the current value of the sample with no nitrogen added. In the samples with nitrogen added to the sputter gas, a little fluctuation is found in the characteristics but does not depend on the addition ratio of the nitrogen. Based on the result shown in FIG. 3, it is found that the samples with nitrogen added to the sputter gas by at least not less than 5% have characteristics different from those of the sample with no nitrogen added.

FIG. 4 is a graph illustrating the current-voltage characteristics of the resistance memory element in the forming. The "forming" is for giving the resistance memory element the resistance memory characteristics that its high resistance state and low resistance state can be reversibly switched, and in the forming, a voltage corresponding to the dielectric breakdown voltage is applied. It is considered that the voltage is applied to the resistance memory element 14 to cause soft breakdown in the resistance memory layer 14, whereby a filament-shaped current path is formed in the resistance memory layer 14, and by this filament-shaped current path, the resistance memory characteristics are given. The forming may be made once in the initial state and is unnecessary thereafter.

As shown in FIG. 3, the resistance memory element in the initial state before the forming has the high resistance. As the positive voltages are being applied to the resistance memory element, as shown in FIG. 4, the dielectric breakdown takes place at about 4 V, and the current abruptly increases. That is, the forming is being made.

FIGS. 5 and 6 are graphs illustrating the current-voltage characteristics of the resistance memory element after the forming. FIG. 5 shows the current-voltage characteristics at the time of applying voltages in both negative and positive directions. FIG. 6 shows the current-voltage characteristics at the time of applying voltages only in the positive direction. In this specification, when a higher voltage is applied to the upper electrode layer 18 than to the lower electrode layer 14, the direction of the application of the voltage is positive, and when a higher voltage is applied to the lower electrode 14 than to the upper electrode layer 18, the direction of the application of the voltage is negative direction. The characteristics shown in FIGS. 5 and 6 made substantially no change when the addition ratio of nitrogen to the sputter gas for depositing the titanium nitride film 12 was changed in the range of 5%-95%.

As shown in FIG. 5, as negative voltages are being applied to the resistance memory element in the high resistance state, the phenomenon that the current abruptly increases at the applied voltage of about −1.3 V (set operation) takes place. That is, the resistance memory element changes from the high resistance state into the low resistance state. The voltage at which the set operation is caused is called the set voltage.

As positive voltages are being applied to the resistance memory element in the low resistance state, the phenomenon that the current decreases at the applied voltage of about 0.5 V (reset operation) takes place. That is, the resistance memory element changes from the low resistance state into the high resistance state. The reset operation does not take place by the negative voltage application. The voltage at which the reset operation is caused is called the reset voltage.

While the applied voltage is between the set voltage and the reset voltage, the resistance memory element remains as it is. That is, the resistance memory element functions as a memory device memorizing the high resistance state or the low resistance state.

As described above, the resistance memory element according to the present embodiment can make the set operation by the negative voltage application and can make the reset operation by the positive voltage application. In this specification, the operation mode of making the set operation and the reset operation by application of voltages of different polarities is called the bipolar operation.

As shown in FIG. 6, as positive voltages higher than the reset voltage are being applied to the resistance memory element in the high resistance state, the phenomenon that the current abruptly increases when the applied voltage is about 3.0 V (set operation) takes place. That is, the resistance memory element is changed from the high resistance state into the low resistance state.

As positive voltages are being applied to the resistance memory element in the low resistance state, the phenomenon that the current decreases when the applied voltage is about 0.8 V (reset operation) takes place. That is, the resistance memory element changes from the low resistance state into the high resistance state.

When the applied voltage is less than the reset voltage, the resistance memory element remains as it is. That is, the resistance memory element functions as a memory device memorizing the high resistance state or the low resistance state.

As described above, the resistance memory element according to the present embodiment can make also the set operation and the reset operation by the positive voltage application. In this specification, the operation mode of making the set operation and the reset operation by application of voltages of the same polarity is called the unipolar operation.

In the set operation in which resistance memory element is changed from the high resistance state into the low resistance state, due to the abrupt resistance value decrease, the current flowing in the resistance memory element abruptly increases. For the prevention of the breakage of the element and the peripheral circuit due to the flow of the large current in the resistance memory element, it is preferable that the write circuit includes a current limiting means using, e.g., a select transistor.

The current limited value is determined corresponding to the current-voltage characteristics (switching current) of the resistance memory element. In the resistance memory element according to the present embodiment, the current limited values is hundreds μA—some mA for the negative polarity and tens mA for the positive polarity, and characteristically, the current limited value for the positive polarity is larger by 1 place or more than the current limited value for the negative polarity.

For example, for the bipolar operation of FIG. 5, the current limited value can be set about −0.001 A. For example, for the unipolar operation of FIG. 6, the current limited value can be set at about 0.015 A. That is, a merit of resistance memory element making the bipolar operation is that the switching current in the reset operation can be decreased by about 1 place.

FIG. 7 is a graph illustrating the current-voltage characteristics, in the bipolar operation, of a sample having nitrogen added by 5% in the sputter gas for depositing the titanium nitride film 12 (solid line) and a sample with no nitrogen added in the sputter gas for depositing the titanium nitride film 12 (dotted line).

As shown in FIG. 7, the bipolar operation can be made by both the sample with nitrogen added by 5% in the sputter gas for depositing the titanium nitride film 12 and the sample with no nitrogen added in the sputter gas for depositing the titanium nitride film 12 (i.e., the sample having a titanium film formed in place of the titanium nitride film 12).

However, the sample with no nitrogen added has the current required for the switching is larger by not less than 1 place than the sample with nitrogen added. In comparison with both samples in the limited current value, the limited current value of the sample with no nitrogen added was 20 mA, and that of the sample with nitrogen added was 1 mA. That is, a merit of using the titanium nitride film 12 as the base material of the titanium oxide film as the resistance memory layer 14 is the decrease of the switching current by not less than 1 place.

The current-voltage characteristics in the unipolar operation were measured on the same samples, but on the sample with no nitrogen added, the switching characteristics could not be observed due to the too large switching current thereof.

FIGS. 8 and 9 are graphs illustrating the current-voltage characteristics of the resistance memory element with the film thickness of the titanium nitride film 12 varied. FIG. 8 shows the current-voltage characteristics of the sample having the titanium nitride film 12 of a 50 nm-thickness. FIG. 9 shows the current-voltage characteristics of the sample having the titanium nitride film 12 of a 30 nm-thickness. In the sample of FIG. 8 having the titanium nitride film 12 of a 50 nm-thickness, the titanium nitride film 12 a little resides between the platinum film 10 and the resistance memory layer 16. In the sample of FIG. 9 having the titanium nitride film 12 of a 30 nm-thickness, all the titanium nitride film 12 is oxidized, and the resistance memory layer 16 of titanium oxide film is formed on the platinum film 10.

As illustrated in FIG. 8, the sample having the titanium nitride film 12 of a 50 nm-thickness has substantially the same characteristics as the sample having the titanium nitride film of a 200 nm-thickness, which has been described above. It is considered that the titanium nitride film 12 can produce the effect as far as it a little remains.

In contrast to this, as shown in FIG. 9, the sample having the titanium nitride film 12 of a 20 nm-thickness has the symmetric unipolar resistance memory characteristics for the positive voltage application and for the negative voltage application and does not have the bipolar resistance memory characteristics of FIG. 8. This will be because the sample of FIG. 9 has the lower electrode layer 14 and the upper electrode layer 18 which are in contact with the resistance memory layer 16 is formed of platinum film and have the symmetric current-voltage characteristics.

That is, a merit of leaving the titanium nitride film 12 as the lower electrode on the side of the resistance memory layer 16 is that the bipolar resistance memory characteristics can be provided, which leads to the switching current decrease.

FIG. 10 is a graph illustrating the X-ray diffraction spectrum of the sample having a titanium oxide film formed by thermally oxidizing a titanium nitride film at 550° C.

As shown in FIG. 10, in the sample subjected to the 550° C. thermal oxidation, the peak of rutile phase can be confirmed.

Based on the results of the cross-sectional TEM (transmission electron microscope) observation and the electron diffraction, it was found that the titanium oxide film formed by the thermal oxidation at 550° C. is formed of about 10 nm-particle diameter crystallites of rutile phase.

The switching speed was measured on the resistance memory element according to the present embodiment, and it was confirmed that the resistance memory element makes the set operation and the reset operation with pulses of not more than 5 nsec.

The resistance memory element of the same material group is disclosed in, e.g., M. Fujimoto et al., "High-speed resistive switching of $TiO_2$/TiN nano-crystalline thin film", Japanese Journal of Applied Physics, Vol. 45, No. 11, 2006, pp. L310-L312. M. Fujimoto et al. disclose that the set operation can be made with pulses of −2 V and 20 nsec, and the reset operation can be made with pulses of +2.2 V and 30 nsec.

In comparison with the switching speed of the resistance memory element according to the present embodiment with these values, it is found that the switching speed can be much decreased for both the set operation and the reset operation.

The mechanism for improving the switching speed of the resistance memory element according to the present embodiment is not clear. However, the inventors of the present application consider that it will be due to the crystal structure of the titanium oxide film.

In the resistance memory element disclosed by M. Fujimoto et al., the titanium oxide film is formed of nano-sized (2-5 nm) dots of the anatase phase. In the resistance memory element according to the present embodiment, however, the titanium oxide film is formed of about 10 nm-particle diameter crystallites of the rutile phase. The resistance memory element disclosed by Fujimoto et al. does not require the forming processing, and is different in the electric characteristics from the resistance memory element according to the present embodiment, which requires the forming processing.

Based on the above, a difference in the characteristics between the resistance memory element disclosed by Fujimoto et al. and the resistance memory element according to the present embodiment will be due to the crystal structure of the titanium structure of the titanium oxide film, and the switching speed increase will be due to the crystallites of the rutile phase forming the titanium oxide film.

The rutile phase of the high-temperature phase is stable in comparison with the anatase phase. The anatase phase is heated at high temperatures to be the rutile phase. The phase transition temperature of a crystal is determined mainly by an impurity, and purer crystals are transited at lower temperatures. It is known that the switching of the ReRAM is accompanied by heat (refer to, e.g., K. Kinoshita et al., Applied Physics Letters, Vol. 89, 2006, 103509), and especially in the reset operation, large current flows, which will heat the element. Such heating changes the anatase phase to the rutile phase, and there is a possibility that the repetition of the switching will change the characteristics. However, the rutile phase, which is stable, does not have the risk of the structure due to the heating.

As described above, according to the present embodiment, titanium nitride film is thermally oxidized to form titanium oxide film of crystallites of the rutile phase, and the resistance memory element includes the resistance memory layer of the titanium oxide film, whereby the resistance memory element can have high switching speed and small switching current.

A Second Embodiment

The nonvolatile semiconductor memory device and the method of manufacturing the same according to a second embodiment will be explained with reference to FIGS. 11 to 14B.

Figure 11:
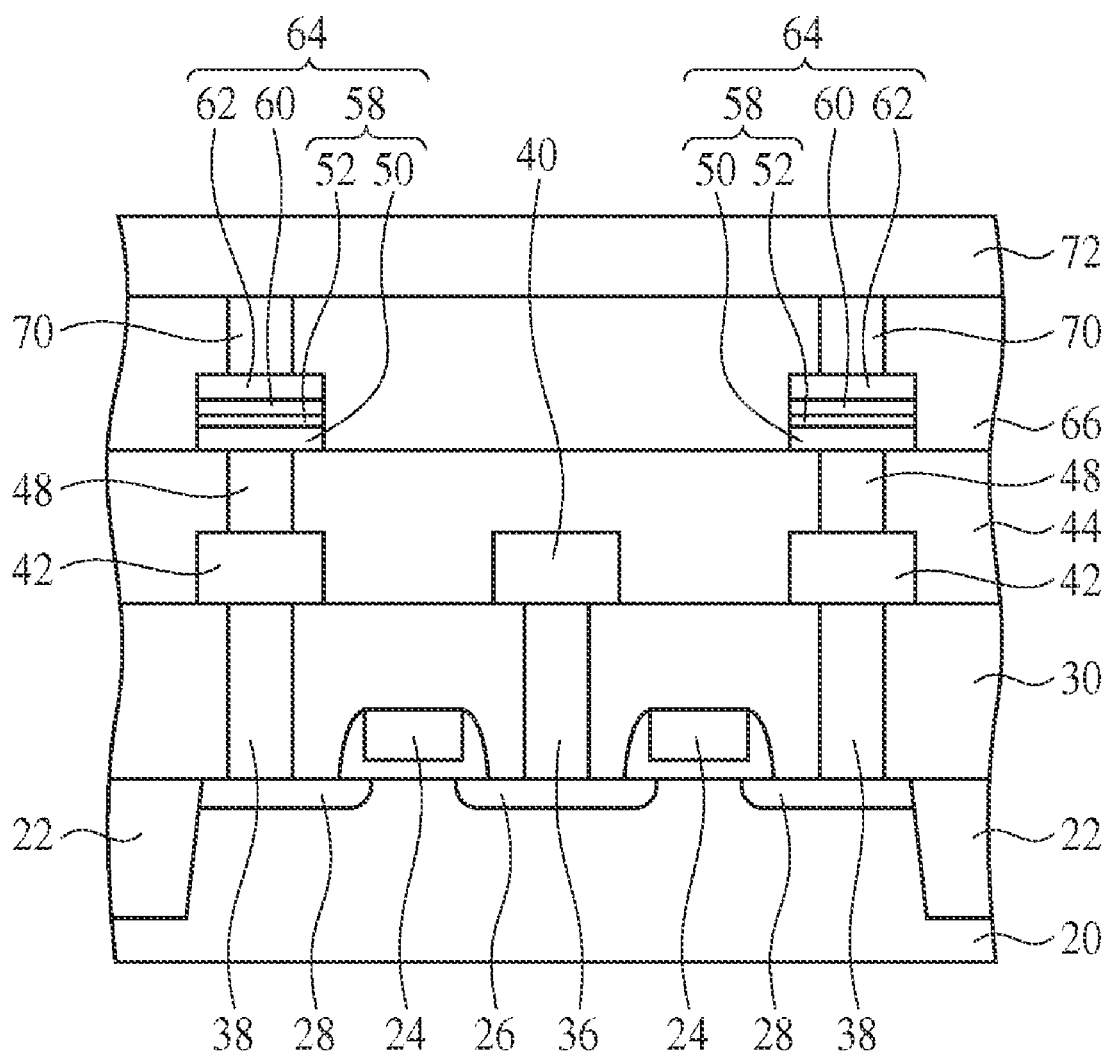
FIG. 11 is a diagrammatic sectional view illustrating a structure of the nonvolatile semiconductor memory device according to a second embodiment.

FIG. 11 is a diagrammatic sectional view illustrating a structure of the nonvolatile semiconductor memory device according to the present embodiment. FIGS. 12A-14B are sectional views illustrating a method of manufacturing the nonvolatile semiconductor memory according to the present embodiment.

First, the structure of the nonvolatile semiconductor memory device according to the present embodiment will be explained with reference to FIG. 11.

A device isolation film 22 for defining device regions is formed in a silicon substrate 20.

Over the silicon substrate 20 with the device isolation film 22 formed in, gate electrodes 24 functioning also as word lines extended in the vertical direction of the drawing are formed. In the active regions on both sides of the gate electrodes 24, source/drain regions 26, 28 are formed. Thus, in the device regions, select transistors each including the gate electrode 24 and the source/drain regions 26, 28 are formed.

Over the silicon substrate 20 with the select transistors formed on, an inter-layer insulating film 30 is formed. In the inter-layer insulating film 30, contact plugs 36 connected to the source/drain regions 26 and contact plugs 38 connected to the source/drain regions 28 are buried.

Over the inter-layer insulating film 30, ground lines 40 electrically connected to the source/drain regions 26 (source terminals) via the contact plugs 36, and relay interconnections 42 electrically connected to the source/drain regions (drain terminals) via the contact plugs 38 are formed.

Over the inter-layer insulating film 30 with the ground lines 40 and the relay interconnections 42 formed on, an inter-layer insulating film 44 is formed. In the inter-layer insulating film 44, contact plugs 48 connected to the relay interconnections 42 are buried.

Over the inter-layer insulating film 44 with the contact plugs 48 buried in, the resistance memory elements 64 are formed. The resistance memory elements 64 are each electrically connected to the source/drain region 28 via the contact plug 48, the relay interconnection 42 and the contact plug 38, and each include a lower electrode layer 58 of the layer film of a platinum film 50 and a titanium nitride film 52, a resistance memory layer 60 of a titanium oxide film formed on the lower electrode layer 58 and an upper electrode layer 62 of a platinum film formed on the resistance memory layer 60.

Over the inter-layer insulating film 44 with the resistance memory elements 64 formed on, an inter-layer insulating film 66 is formed. In the inter-layer insulating film 66, contact plugs 70 connected to the upper electrode layer 62 of the resistance memory elements 64 are buried.

Over the inter-layer insulating film 66 with the contact plugs 70 buried in, bit lines 72 electrically connected to the upper electrode layer 62 of the resistance memory elements 64 via the contact plug 70 are formed.

Thus, the nonvolatile semiconductor memory according to the present embodiment is constituted.

Next, the method of manufacturing the nonvolatile semiconductor memory according to the present embodiment will be explained with reference to FIGS. 12A to 14B.

First, in the silicon substrate 10, the device isolation film 22 for defining device regions is formed by, e.g., STI (Shallow Trench Isolation) method.

Figure 12A:
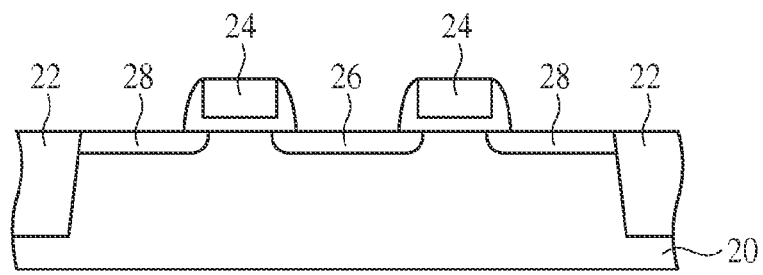
FIGS. 12A-12C, 13A-13C, and 14A-14B are sectional views illustrating a method of manufacturing the nonvolatile semiconductor memory according to the second embodiment.

Then, over the silicon substrate 20 in the device regions, select transistors each including the gate electrode 24 and the source/drain regions 26, 28 are formed in the same way as in the usual MOS transistor manufacturing method (FIG. 12A).

Next, over the silicon substrate 20 with the select transistors formed on, a silicon oxide film is deposited by, e.g., CVD (chemical vapor deposition) method, and the surface of the silicon oxide film is polished by, e.g., CMP (chemical mechanical polishing) method to form the inter-layer insulating film 30 of silicon oxide film having the surface planarized.

Next, by photolithography and dry etching, the contact holes 32, 34 down to the source/drain regions 26, 28 are formed in the inter-layer insulating film 30.

Figure 12B:
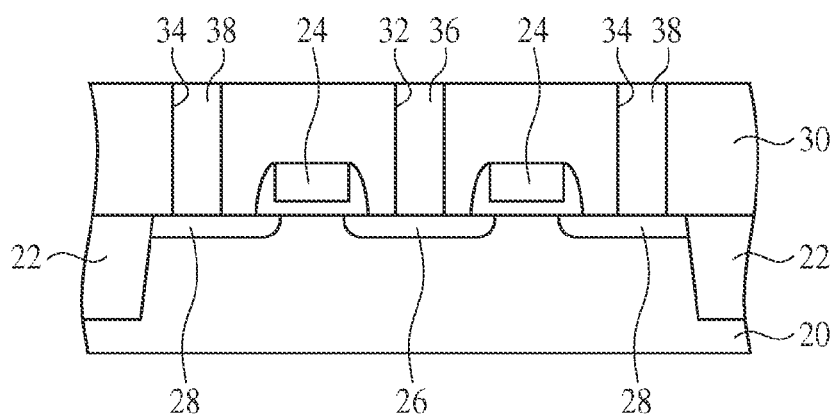

Then, a barrier metal and a tungsten film are deposited by, e.g., CVD method, and these conductive films are etched back to form in the contact holes 32, 34 the contact plugs 36, 38 electrically connected to the source/drain regions 26, 28 (FIG. 12B).

Figure 12C:
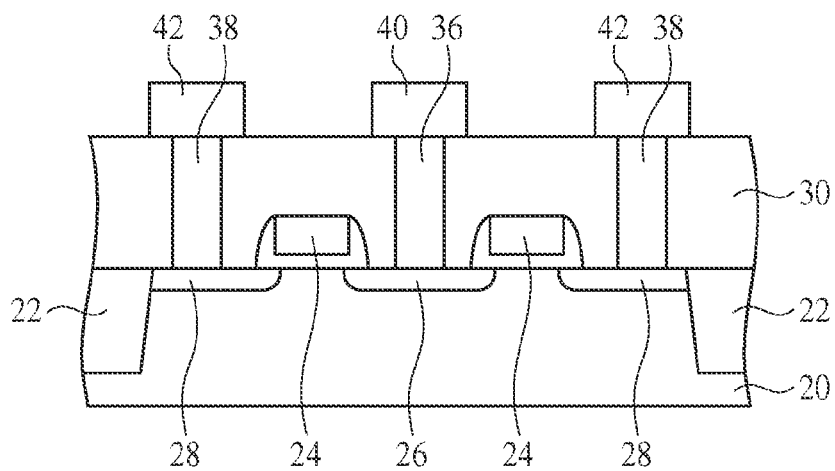

Next, over the inter-layer insulating film 30 with the contact plugs 36, 38 buried in, a conductive film is deposited by, e.g., CVD method, and then the conductive film is patterned by photolithography and dry etching to form the ground lines 40 electrically connected to the source/drain regions 26 via the contact plugs 38, and the relay interconnections 42 electrically connected to the source/drain regions 28 via the contact plugs 38 (FIG. 12C).

Next, over the inter-layer insulating film 30 with the ground lines 40 and the relay interconnections 42 formed on, a silicon oxide film is deposited by, e.g., CVD method, and the surface of the silicon oxide film is polished by, e.g., CMP method to form the inter-layer insulating film 44 of silicon oxide film having the surface planarized.

Next, by photolithography and dry etching, the contact holes 46 down to the relay interconnections 42 are formed in the inter-layer insulating film 44.

Figure 13A:
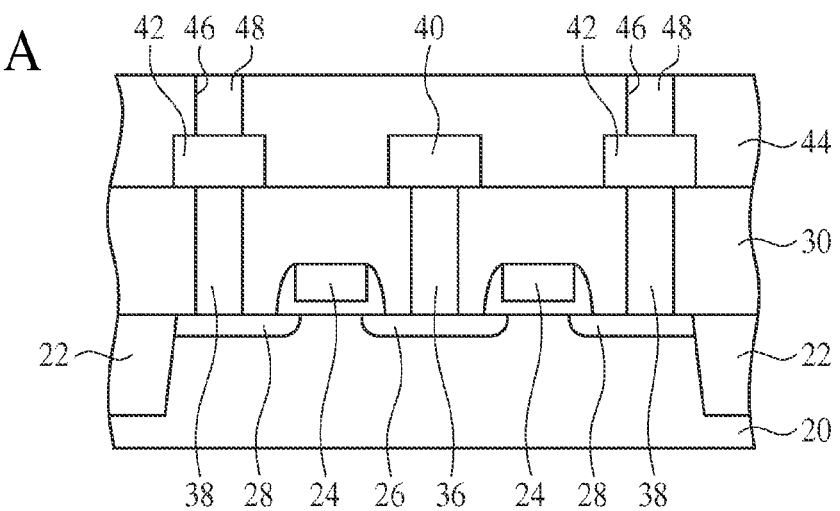

Next, a barrier metal and a tungsten film are deposited by, e.g., CVD method, and these conductive films are etched back to form in the contact holes 46 the contact plugs 48 electrically connected to the source/drain regions 28 via the relay interconnections 42 the contact plugs 38 (FIG. 13A).

Next, over the inter-layer insulating film 44 with the contact plugs 48 buried in, a 100 nm-thickness platinum film 50, for example, is deposited by, e.g., sputtering method.

Figure 13B:
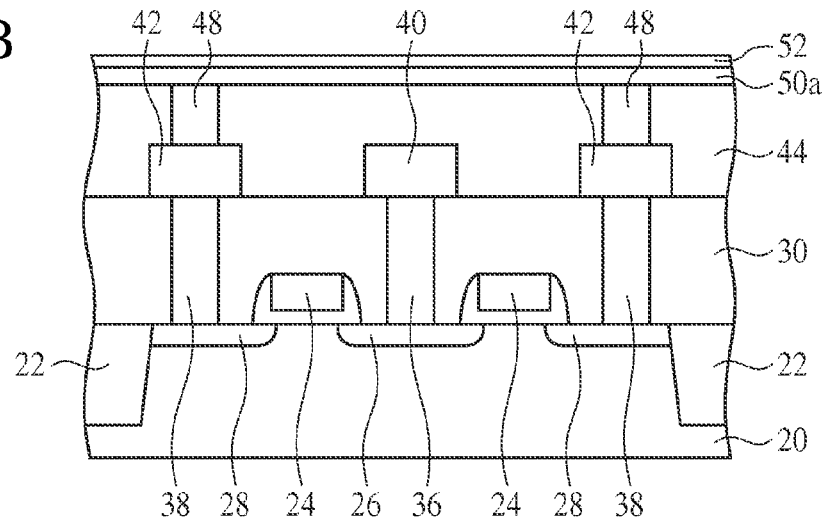

Next, over the platinum film 50, a 100 nm-thickness titanium nitride film 52, for example, is formed by, e.g., reactive sputtering method (FIG. 13B). At this time, as the sputter target, titanium is used, and the mixed gas of nitrogen (N) and argon (Ar) is used as the sputter gas.

Figure 13C:
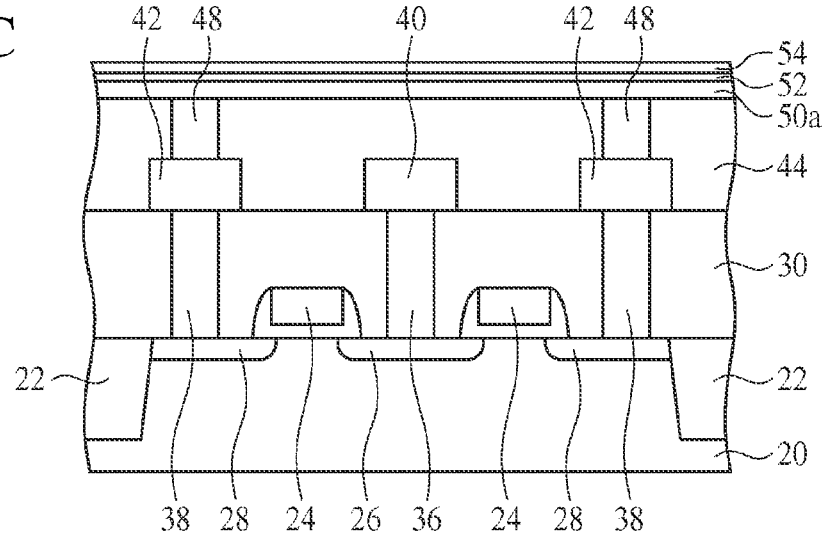

Next, thermal processing of 500-600° C. is made in an oxygen atmosphere to thereby oxidize the surface of the titanium nitride film 52. Thus, on the titanium nitride film 52, a 70 nm-thickness titanium oxide film 54 is formed (FIG. 13C). The oxidation processing is made at 500° C.-600° C., whereby the titanium oxide film 54 to be formed has crystallites of the rutile phase.

Next, over the titanium oxide film 54, a 50 nm-thickness platinum film 56, for example, is formed by, e.g., sputtering method.

Figure 14A:
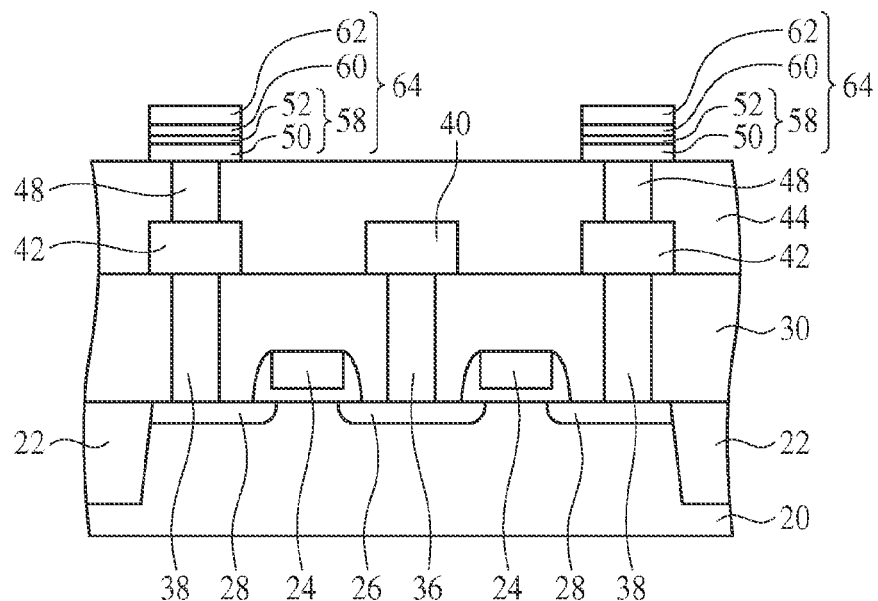

Next, by photolithography and dry etching, the platinum film 56, the titanium oxide film 54, the titanium nitride film 52 and the platinum film 50 are patterned to form the resistance memory elements 62 each including the lower electrode layer 58 of the layer film of the platinum film 50 and the titanium nitride film 52, the resistance memory layer 60 of the titanium oxide film 54 and the upper electrode layer 62 of the platinum film 56 (FIG. 14A).

Next, over the inter-layer insulating film 44 with the resistance memory elements 64 formed on, a silicon oxide film is deposited by, e.g., CVD method, and the surface of the silicon oxide film is polished by, e.g., CMP method to form the inter-layer insulating film 66 of silicon oxide film having the surface planarized.

Next, by photolithography and dry etching, the contact holes 68 down to the upper electrode layers 62 of the resistance memory elements 64 are formed in the inter-layer insulating film 66.

Next, a barrier metal and a tungsten film are deposited by, e.g., CVD method, and these conductive films are etched back to form in the contact holes 68 the contact plugs 70 connected to the upper electrode layers 62 of the resistance memory elements 64.

Figure 14B:
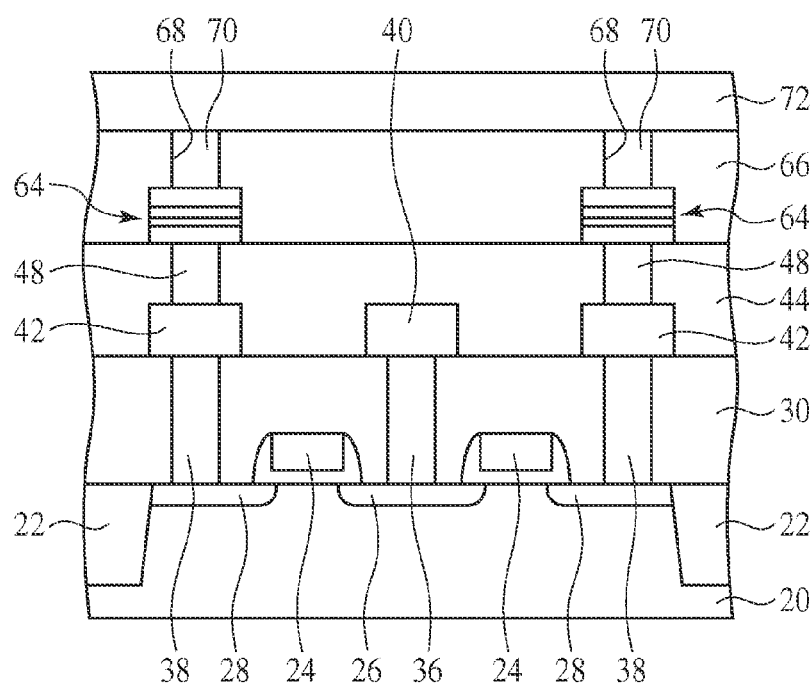

Next, over the inter-layer insulating film 66 with the contact plugs 70 buried in, a conductive film is deposited, and the conductive film is patterned by photolithography and dry etching to form the bit lines 72 electrically connected to the upper electrode layer 62 of the resistance memory elements 62 via the contact plugs 70 (FIG. 14B).

Then, upper-level interconnection layers, etc. are formed as required, and the nonvolatile semiconductor device is completed.

As described above, according to the present embodiment, the nonvolatile semiconductor memory device is constituted with the resistance memory element according to the first embodiment, whose switching speed is high and whose switching current is small, whereby the nonvolatile semiconductor memory device can have high write speed and small electric power consumption.

Modified Embodiments

The above-described embodiments can cover other various modifications.

For example, in the above-described embodiments, the resistance memory element of the Pt/TiO$_2$/TiN structure is described, but the resistance memory element of the Pt/WO$_x$/WN structure can produced the same characteristics.

Figure 15:
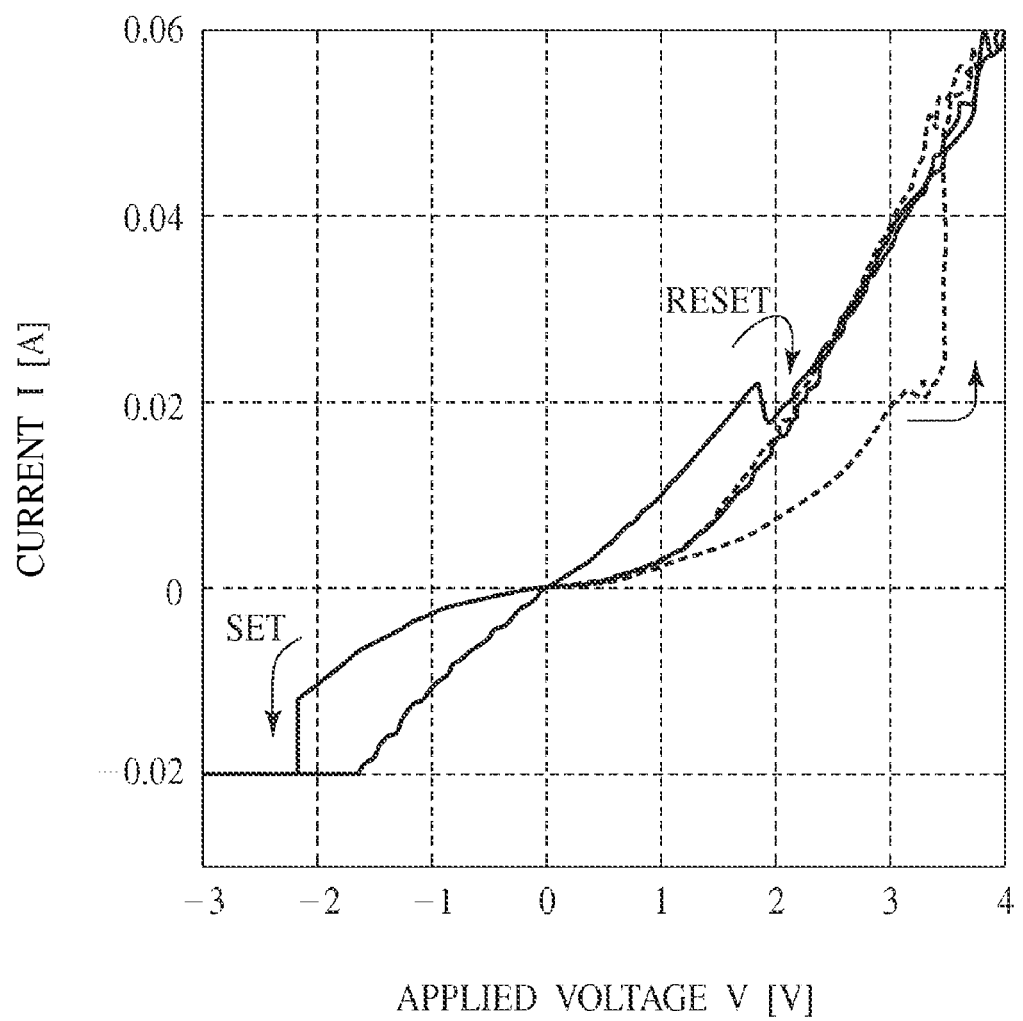
FIG. 15 is a graph illustrating the current-voltage characteristic of the resistance memory element according to a modification of the embodiment.

FIG. 15 is a graph of the current-voltage characteristics of a sample including the resistance memory layer of tungsten oxide (WO$_x$) film formed by depositing a 200 nm—thickness tungsten nitride (WN) film by reactive sputtering method with the temperature set at the room temperature, the flow rate of nitrogen as the sputter gas set at 25 cc and the argon flow rate set at 5 cc, then thermally oxidizing the surface of the tungsten nitride film under the conditions of 500° C. and 10 minutes, and then forming the upper electrode layer of platinum on the resistance memory layer.

As shown in FIG. 15, the resistance memory element of the Pt/WO$_x$/WN structure can realize the same resistance memory characteristics as the resistance memory characteristics of the resistance memory element of the Pt/TiO$_2$/TiN structure shown in FIG. 5.

Although the inventors of the present application have not made specific studies, the use of transition metal nitrides, as of hafnium nitride (HfN), zirconium nitride (ZrN), tantalum nitride (TaN), etc., as the lower electrode layer is expected to produce the same result as the use of titanium nitride and tungsten nitride.

In the above-described embodiments, the constituent material of the upper electrode layer and the base film of the lower electrode layer is platinum, but other than platinum, noble metal materials such as ruthenium (Ru), iridium (Ir), rhodium (Rh), palladium (Pd), etc. may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A resistance memory element which memorizes a high resistance state and a low resistance state and is switched between the high resistance state and the low resistance state by an application of a voltage, comprising:
   a lower electrode including a metal film of a noble metal material and a titanium nitride film formed on the metal film;
   a resistance memory layer formed on the titanium nitride film of the lower electrode and formed of a titanium oxide having a crystal structure of rutile phase; and
   an upper electrode formed on the resistance memory layer.

2. A semiconductor memory device comprising:
   a resistance memory element including a lower electrode including a metal film of a noble metal material and a titanium nitride film formed on the metal film, a resistance memory layer formed on the titanium nitride film of the lower electrode and formed of a titanium oxide having a crystal structure of rutile phase, and an upper electrode formed on the resistance memory layer, for memorizing a high resistance state and a low resistance state and being switched between the high resistance state and the low resistance state by an application of a voltage; and
   a select transistor connected to the lower electrode or the upper electrode of the resistance memory element.

* * * * *